United States Patent

Jeon et al.

[11] Patent Number: 5,812,483
[45] Date of Patent: Sep. 22, 1998

[54] INTEGRATED CIRCUIT MEMORY DEVICES INCLUDING SPLIT WORD LINES AND PREDECODERS AND RELATED METHODS

[75] Inventors: Jun-Young Jeon, Seoul; Gi-Won Cha, Kyungki-do; Sang-Jae Lee, Seoul, all of Rep. of Korea

[73] Assignee: Samsung Electronics Co., Ltd., Suwon, Rep. of Korea

[21] Appl. No.: 744,441

[22] Filed: Nov. 8, 1996

[30] Foreign Application Priority Data

Nov. 9, 1995 [KR] Rep. of Korea .................. 1995-40557

[51] Int. Cl.$^6$ ...................................................... G11C 7/00
[52] U.S. Cl. ............................... 365/230.06; 365/230.03; 365/230.04; 365/189.11
[58] Field of Search ........................ 365/230.06, 230.03, 365/230.04, 189.05, 189.11

[56] References Cited

U.S. PATENT DOCUMENTS

| | | | |
|---|---|---|---|
| 5,148,401 | 9/1992 | Sekino et al. | 365/230.03 |
| 5,502,683 | 3/1996 | Marchioro | 365/230.04 |
| 5,517,456 | 5/1996 | Chishiki | 365/230.04 |

Primary Examiner—Vu A. Le
Attorney, Agent, or Firm—Myers, Bigel, Sibley & Sajovec, L.L.P.

[57] ABSTRACT

An integrated circuit memory device includes a memory cell array including a plurality of odd and even numbered subword lines extending therethrough. A predecoder receives a row address and generates a plurality of predecoding signals in response thereto, and a row decoder receives the row address and generates a word line signal in response thereto. A first driver block includes a first plurality of word line drive circuits adjacent the memory cell array wherein each of the word line drive circuits of the first plurality is connected to a respective odd numbered subword line of the memory cell array. A first plurality of subword line drive circuits drive the respective odd numbered subword lines responsive to odd numbered predecoding signals and the word line signal. A second driver block includes a second plurality of word line drive circuits adjacent the memory cell array opposite the first driver block wherein each of the word line drive circuits of the second plurality is connected to a respective even numbered subword line of the memory cell array. The second plurality of subword line drive circuits drive the respective even numbered subword lines responsive to even numbered predecoding signals and the word line signal. Related methods are also disclosed.

21 Claims, 3 Drawing Sheets

INTEGRATED CIRCUIT MEMORY DEVICES INCLUDING SPLIT WORD LINES AND PREDECODERS AND RELATED METHODS

FIELD OF THE INVENTION

The present invention relates to the field of integrated circuits and more particularly to the field of integrated circuit memory devices.

BACKGROUND OF THE INVENTION

On an integrated circuit memory device, the memory cells occupy the majority of the space (area), and the number of memory cells determine the memory capacity of the device. The integration density of a memory device is thus determined in large part by the size of each memory cell. In a dynamic random access memory (DRAM), column and row decoders are provided to select specific memory cells in response to address signals. Accordingly, in dynamic random access memories having memory capacities of 64 MB to 256 MB or greater, the transistors making up the column and row decoders also become a factor making further integration difficult.

A single column decoder is required for a pair of two bit lines for a parallel test when a multi-bit test function is provided in a dynamic random access memory. Accordingly, the layout for a column decoder driver can be designed relatively easily. Two row decoders, however, may be required for every word line connected to respective memory cells. In addition, word line drive circuits drive word lines connected to memory cells in response to the outputs of row decoders. The layout of these word line drive circuits may thus act as a factor making higher degrees of integration more difficult to obtain.

Furthermore, the access time of a dynamic random access memory is determined in part by the time required to charge the word lines after the voltages on the corresponding decoder output lines begin to rise. By reducing the time required to charge the word lines, the access time for the memory device can thus be reduced. To increase the integration of the memory cell, however, it may be necessary to reduce the pitch of the word lines. As the integration density of a memory device is increased, however, the number of memory cells connected to each word line is increased and the word line drive circuit may be required to have a larger current driving capacity. More particularly, the transistors making up the word line drive circuit may be required to have a larger driving capacity thus increasing the area occupied by each of these transistors. Accordingly, increased integration may require that the area occupied by the drive circuits be reduced in a vertical dimension in a direction orthogonal to the word lines while providing a larger driving capacity for these drive circuits. Both of these criteria, however, may be difficult to achieve at once because larger areas are typically required for drive circuits having larger driving capacities.

To address these issues, a dynamic random access memory with split word lines is discussed in U.S. Pat. No. 5,148,401 entitled "DRAM With Split Word Lines" to Sekino et al. An example of a DRAM with a split word drive configuration is illustrated in FIG. 1. As shown, first and second memory cell arrays 15 and 16 are provided to the left and the right, and each of the word lines 20-1 and 20-2 is split into two subword lines extending through the first and the second memory cell arrays 15 and 16. The word line drive circuits 11, 12, 13, and 14 drive the subword lines 21, 22, 23, and 24, in the memory cell arrays 15 and 16. The word line drive circuits are divided into three blocks 25-1, 25-2, and 25-3. The first block 25-1 is disposed between the memory cell arrays 15 and 16 and is connected to the subword lines 22 and 23. The second block 25-2 and the third block 25-3 are disposed adjacent the memory cell arrays opposite the first block and these blocks are respectively connected to the subword lines 21 and 24.

Because the word line drive circuits for the respective word lines are disposed between the memory cell arrays and to the outside of each of the memory cell arrays, the area occupied by the word line drive circuit for each subword line can extend twice the pitch of the word line. Accordingly, the pitch of the word line can be reduced and/or the size of the word line drive circuits can be increased.

The reduction in the size of the respective word line drive circuits may however be limited even though the degree of integration is increased. Furthermore, this configuration may require a number of subword lines equal to the number of the main word lines and may also require that the pitch of the subword lines be determined by the size of the corresponding word line drive circuit. Accordingly, even if the degree of integration is increased using the split word line configuration discussed above, the pitch of the main word lines and the pitch of the subword lines may not be sufficiently reduced. As a result, the conventional split word line drive configuration may be insufficient for integrated circuit memory devices having higher levels of integration.

Accordingly, there continues to exist a need in the art for integrated circuit memory devices including improved word line drive circuits and methods.

SUMMARY OF THE INVENTION

It is therefore an object of the present invention to provide improved integrated circuit memory devices and methods.

It is another object of the present invention to provide integrated circuit memory devices and methods having the capacity for higher levels of integration.

These and other objects are provided according to the present invention by an integrated circuit memory device including a memory cell array having a plurality of odd and even numbered subword lines extending therethrough, a predecoder which receives a row address and generates a plurality of predecoding signals in response thereto, and a row decoder which receives the row address and generates a word line signal in response thereto. A first driver block includes a first plurality of word line drive circuits adjacent the memory cell array wherein each of the word line drive circuits of the first plurality is connected to a respective odd numbered subword line. The first plurality of word line drive circuits drive the respective odd numbered subword lines responsive to odd numbered predecoding signals and the word line signal. A second driver block includes a second plurality of word line drive circuits adjacent the memory cell array opposite the first driver block wherein each of the word line drive circuits of the second plurality is connected to a respective even numbered subword line of the memory cell array. The second plurality of word line drive circuits drive the respective even numbered subword lines responsive to even numbered predecoding signals and the word line signal.

This arrangement allows the word line drive circuits to extend in a vertical direction orthogonal to the word line thereby providing increased integration densities. Stated in other words, the drive circuit for each subword line can occupy space in a vertical dimension provided for multiple subword lines.

More particularly, the memory cell array can include first, second, third, and fourth subword lines. In this case, the first driver block includes a first word line drive circuit connected to the first subword line and a second word line drive circuit connected to the third subword line. In addition, the second driver block includes a first word line drive circuit connected to the second subword line and a second word line drive circuit connected to the fourth subword line. With this arrangement, the word line drive circuit for each word line can occupy four times the pitch of the word lines in the vertical dimension.

With the configuration including four subword lines, the predecoder generates first, second, third, and fourth predecoding signals responsive to the received row address. The first and second word line drive circuits of the first driver block are respectively responsive to the first and third predecoding signals, and the first and second word line drive circuits of the second driver block are respectively responsive to the second and fourth predecoding signals. In particular, the even and odd numbered subword lines of the memory cell array are parallel with the even numbered subword lines being interleaved between the odd numbered subword lines.

The integrated circuit memory device can also include a second memory cell array adjacent the first driver block opposite the first memory cell array, and a third driver block. The second memory cell array includes a second plurality of odd and even numbered subword lines extending through the memory cell array wherein each of the word line drive circuits of the first plurality is connected to a respective odd numbered subword line of the second memory cell array. Accordingly, the first plurality of subword line drive circuits drive the respective odd numbered subword lines responsive to the odd numbered predecoding signals and the word line signal. The third driver block includes a third plurality of word line drive circuits adjacent the second memory cell array opposite the first driver block. Each of the word line drive circuits of the third plurality is connected to a respective even numbered subword line of the second memory cell array. The third plurality of subword line drive circuits drive the respective even numbered subword lines responsive to the even numbered predecoding signals and the word line signal. The structure of the present invention can thus be applied to integrated circuit memory devices having varying numbers of memory cell arrays.

In addition, a plurality of memory cells of the memory cell array can be connected to a respective one of the subword lines. In addition, the subword lines of the memory cell array can be connected through respective word line drive circuits to a common fixed electrical potential. Furthermore, the first and second pluralities of the word line drive circuits can be disposed in parallel with respect to each other and in a direction orthogonal with respect to the word line. The integrated circuit memory device can also include a first plurality of bit lines extending through the memory cell array.

According to another aspect of the present invention, a method is provided for accessing data from an integrated circuit memory device having a memory cell array including a plurality of odd and even numbered subword lines extending through the memory cell array. The memory device also includes a first plurality of word line drive circuits adjacent the memory cell array wherein each of the word line drive circuits of the first plurality is connected to a respective odd numbered subword line of the memory cell array. In addition, a second plurality of word line drive circuits is included adjacent the memory cell array opposite the first plurality of word line drive circuits wherein each of the word line drive circuits of the second plurality is connected to a respective even numbered subword line of the memory cell array.

This method includes the steps of generating a plurality of predecoding signals in response to a received row address, and a generating a word line signal in response to the row address. The respective odd numbered subword lines are driven from the first plurality of word line drive circuits responsive to odd numbered predecoding signals and the word line signal. The respective even numbered subword lines are driven from the second plurality of word line drive circuits responsive to even numbered predecoding signals and the word line signal.

The integrated circuit memory devices and methods of the present invention thus allow higher levels of integration density to be achieved thus allowing increased memory capacity.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
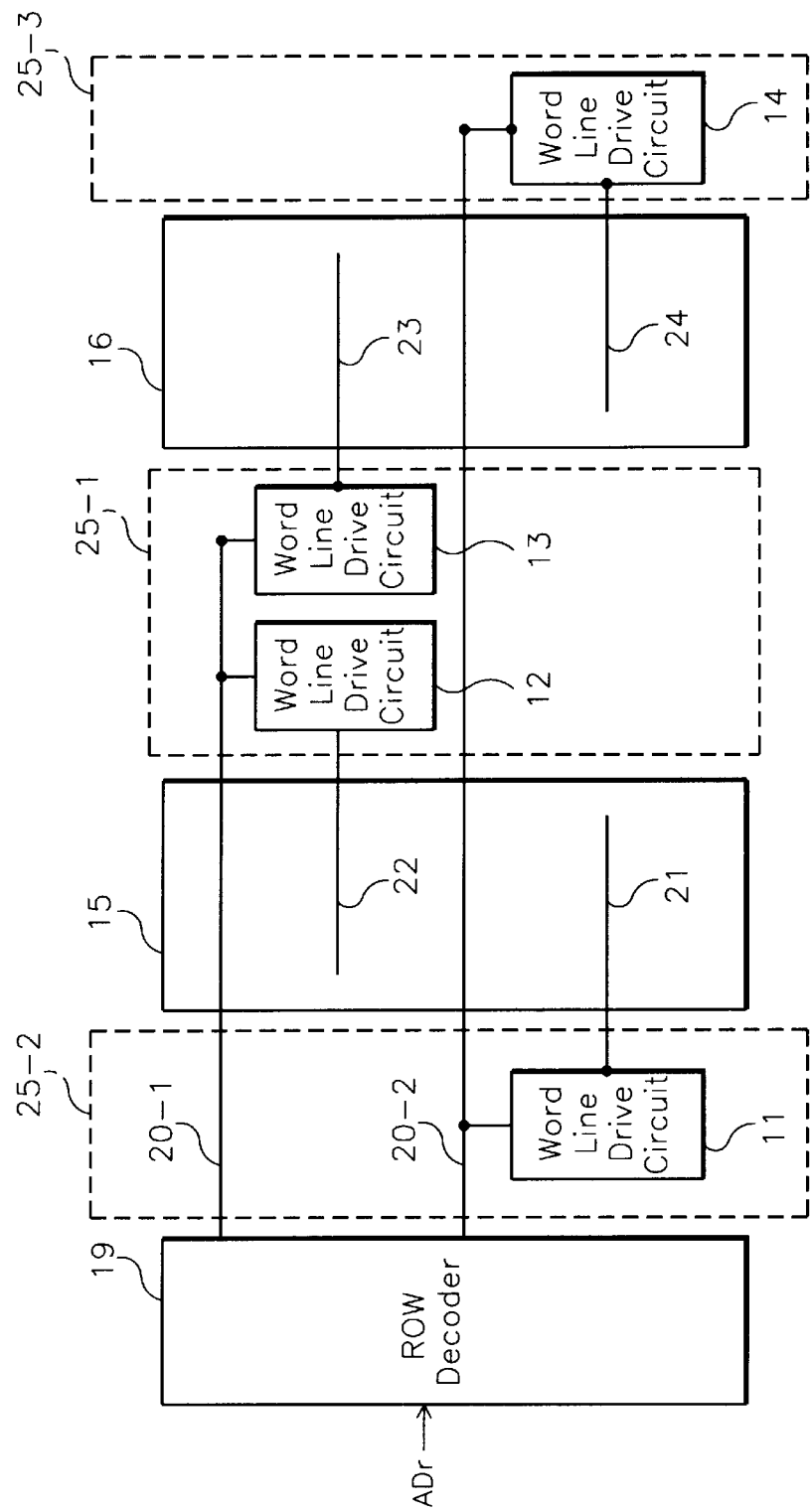
FIG. 1 illustrates a layout for a dynamic random access memory (DRAM) according to the prior art.
Figure 2:
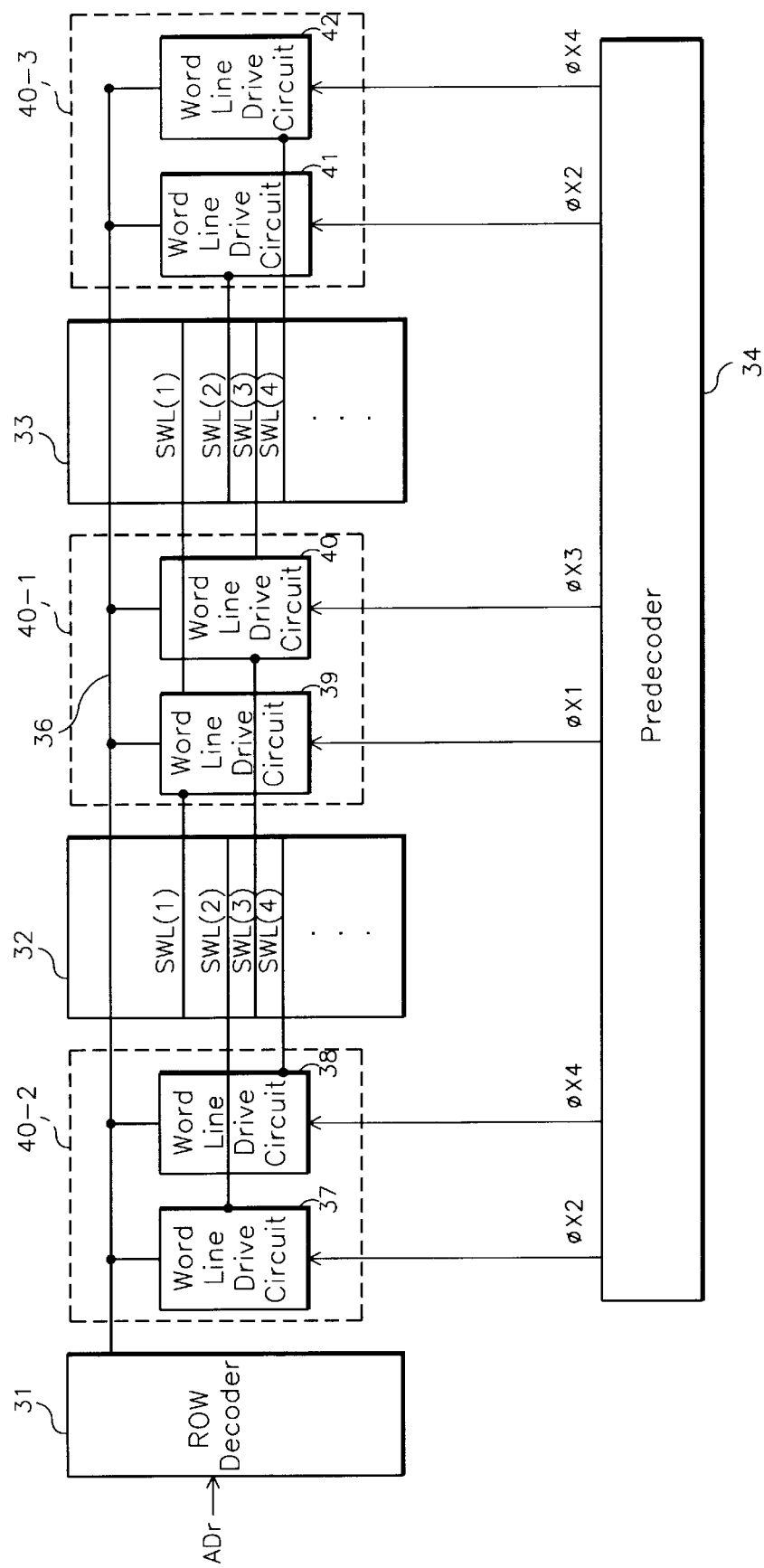
FIG. 2 illustrates a layout for a dynamic random access memory (DRAM) according to a first aspect of the present invention.

An integrated circuit memory device according to the present invention is illustrated in FIG. 2. As shown, first and second memory cell arrays 32 and 33 are disposed to the left and right, and word line drive circuits are provided in the first, second, and third driver blocks 40-1, 40-2, and 40-3. The first driver block 40-1 is provided between the first and second memory cell arrays 32 and 33. The second driver block 40-2 is provided adjacent the first memory cell array 32 opposite the first driver block 40-1. The third driver block 40-3 is provided adjacent the second memory cell array 33 opposite the first driver block 40-1. The word line driver circuits 37–42 provided in the respective driver blocks are selectively activated in response to predecoding signals φX1, φX2, φX3 and φX4. These predecoding signals are generated by a predecoder 34 which predecodes row address signals.

Sense amplifiers are provided adjacent to the top and bottom sides of the memory cell arrays. In addition, a first plurality of bit lines extends through the first memory cell array 32, and a second plurality of bit lines extends through the second memory cell array 33. The word line drive circuits 39 and 40 of the first driver block 40-1 are disposed in parallel with respect to each other and in a direction orthogonal with respect to the word line 36. The word line drive circuits 37 and 38 of second driver block 40-2 are disposed in parallel with respect to each other and in the direction orthogonal with respect to the word line 36. The word line drive circuits 41 and 42 of the third driver block 40-3 are disposed in parallel with respect to each other, and in the direction orthogonal with respect to the word line 36.

In the first driver block 40-1, the main word line 36 is split into two subword lines SWL(1) and SWL(3) for each memory cell array through the word line drive circuits 39 and 40. In addition, the main word line is split into two subword lines SWL(2) and SWL(4) by the word line driver circuits 37 and 38 of the second driver block 40-2 and by the word line driver circuits 41 and 42 of the third driver block 43 for each of the memory cell arrays.

As shown in FIG. 2, the word line drive circuits 39 and 40 of the first driver block 40-1 are provided in parallel between the first and second memory cell arrays 32 and 33. The word line driver circuits 37 and 38 of the second driver block 40-2 are disposed in parallel adjacent to the first memory cell array 32 opposite the first driver block 40-1. The word line driver circuits 41 and 42 of the third driver block 40-3 are disposed in parallel adjacent to the second memory cell array 33 opposite the first driver block 40-1. In other words, the word line drive circuits 39–40 for the respective word lines are disposed at the center and in the direction of the bit lines. The word line drive circuits include word line drive transistors which can be MOS transistors.

More specifically, the odd numbered subword lines SWL(1) and SWL(3) of the first and second memory cell arrays 32 and 33 each extend to the first driver block 40-1 and are commonly connected to the word line drive circuits 39 and 40 as shown. In other words, the subword lines SWL(1) of the memory cell arrays 32 and 33 are commonly connected to the word line drive circuit 39 of the first driver block 40-1, and the subword lines SWL(3) of the memory cell arrays 32 and 33 are commonly connected to the word line drive circuit 40 of the first driver block 40-1.

The even numbered subword lines SWL(2) and SWL(4) of the first memory cell array 32 are respectively connected to the word line drive circuits 37 and 38 of the second driver block 40-2. As shown, the subword line SWL(2) of the first memory cell array 32 is provided between the odd numbered word lines SWL(1) and SWL(3) and is connected to the word line driver circuit 37 of the second driver block 40-2. The subword line SWL(4) of the first memory cell array 32 is provided next to the odd numbered subword line SWL(3) and is connected to the word line drive circuit 38 of the second driver block 40-2.

The second memory cell array 33 also includes even numbered subword lines SWL(2) and SWL(4) and each of these subword lines extend to the third driver block 40-3. In particular, subword line SWL(2) is connected to the word line driver circuit 41, and this subword line is provided between the odd numbered subword lines SWL(1) and SWL(3). The subword line SWL(4) of the second memory cell array 33 is provided next to the odd numbered subword line SWL(3) and is connected to the word line drive circuit 42 of the third driver block 40-3.

Memory cells of each memory cell array are disposed at intersections of the subword lines and the bit lines. If a folded-bit line memory configuration is used, memory cells may not be provided at every intersection. Instead, dummy cells can be connected to respective bit lines to provide a reference voltage Vcc/2. As shown in FIG. 2, the row decoder 31 decodes the row address ADr, and selectively enables the main word line 36 to be at a high level in response to the row address ADr.

The operation of an integrated circuit memory device including split word lines according to the present invention will now be discussed with reference to FIG. 2. For the purposes of this discussion, it will be assumed that the memory cells are of the one-transistor type including a charge storage capacitor connected to a fixed potential and a transfer gate such as a MOS transistor connected between the capacitor and the bit line. As will be understood by one having skill in the art, the transfer gate transfers a charge from the storage capacitor to the bit line.

When data is to be read from a memory cell, a row address ADr is decoded by the row decoder 31, and a word line corresponding to the address is selected. While the row decoder 31 of FIG. 2 is shown having a single word line 36, one having skill in the art will understand that multiple word lines can be provided. In response to the row address, the word line 36 corresponding to the row address is activated. The word line drive circuits of the driver blocks are turned on by the activated word line 36 as the word line is raised to a fixed voltage potential. All of the drive circuits, however, are not selected. In particular, at least one of the word line drive circuits which has been turned on may be selected by a logic combination of the predecoding signals generated by the predecoder 34. Accordingly, at least one of the subword lines SWL(1)–SWL(4) can be raised to the fixed voltage potential by means of the selected word line drive circuits. Assuming that subword lines are raised to the fixed voltage potential during read operations, data stored on the capacitors of the selected memory cells connected to the selected subword lines are transferred to respective bit lines.

For example, to permit the subword lines SWL(1) to be raised to the fixed voltage potential, the word line drive circuit 39 connected to the main word line 36 is selected by the predecoding signal $\phi X1$. To select the subword lines SWL(2) the word line drive circuits 37 and 41 are selected by the predecoding signal $\phi X2$ thus raising the subword lines SWL(2) to the fixed voltage potential. To select the subword lines SWL(4), the word line drive circuits 38 and 42 are selected by the predecoding signal $\phi X4$ thus raising the subword lines SWL(4) to the fixed voltage potential. The subword lines SWL(1) can be activated by the word line drive circuit 39 in response to the predecoding signal $\phi X1$. The subword lines SWL(3) can be activated by the word line drive circuit 40 in response to the predecoding signal $\phi X3$.

In the configuration described above, the word line drive circuits are divided into three driver blocks 40-1, 40-2, and 40-3. The first driver block 40-1 is positioned between the memory cell arrays 32 and 33, the second driver block 40-2 is positioned to the left of the first memory cell array 32, and the third driver block 40-3 is positioned to the right of the second memory cell array 33. Each of the driver blocks includes two word line drive circuits which are disposed in parallel with respect to each other and in the direction of the bit lines. The word line drive circuits 39 and 40 are respectively provided to drive the odd numbered subword lines SWL(1) and SWL(3) of each of the memory cell arrays 32 and 33. The word line drive circuits 37 and 38 are respectively provided to drive the even numbered subword lines SWL(2) and SWL(4) of the first memory cell array 32. Furthermore, the word line drive circuits 41 and 42 are respectively provided to drive the even numbered subword lines SWL(2) and SWL(4) of the memory cell array 33. The drive circuit for each subword line can thus occupy space in the vertical dimension occupied by four word lines. That is, the drive circuit for each word line can have four times the pitch of the word line. In other words, the vertical dimension of the area which each drive circuit can occupy is four times the pitch of the word lines. The size of the word line drive circuit can thus be increased and/or the pitch of the word lines can be reduced. Accordingly, the degree of integration can be increased without decreasing the memory cell size.

Figure 3:
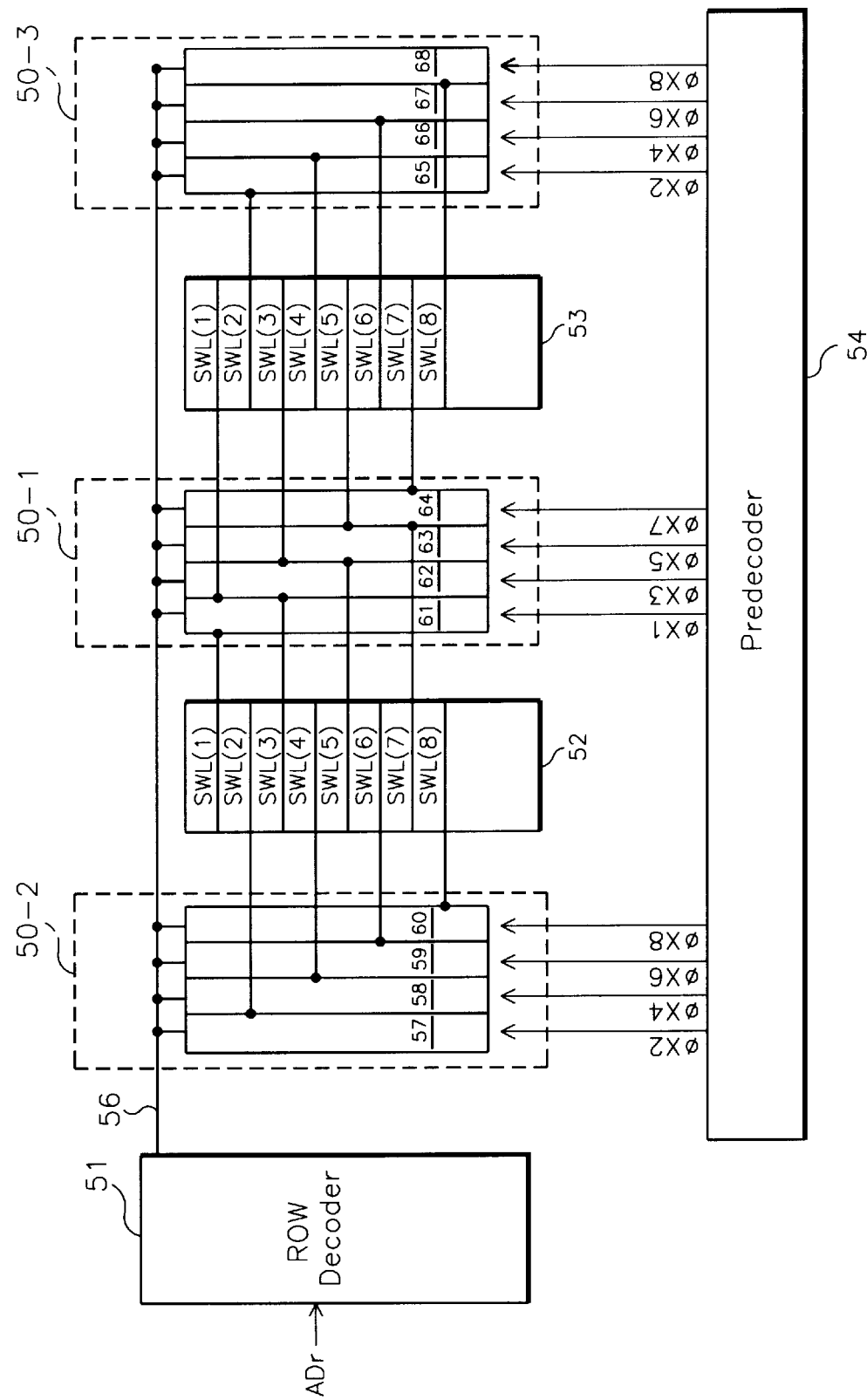
FIG. 3 illustrates a layout for a dynamic random access memory (DRAM) according to a second aspect of the present invention.

The lay-out of an integrated circuit memory device according to another aspect of the present invention is illustrated in FIG. 3. The memory device of FIG. 3 is similar to that of FIG. 2 with the exception that each of the three divided driver blocks has four word line drive circuits which are respectively selected by predecoding signals generated by predecoder 54. As will be understood by one having skill in the art, higher numbers of word line drive circuits can be provided in each driver block.

In the example of FIG. 3, the word line drive circuits are divided into three driver blocks 50-1, 50-2, and 50-3. The first driver block 50-1 is provided between the memory cell arrays 52 and 53, the second driver block 50-2 is provided to the left of the first memory cell array 52, and the third driver block 50-3 is provided to the right of the second memory cell array 53. Each of the driver blocks has four word line drive circuits which are disposed in parallel with respect to each other and in the direction of the bit lines. The word line drive circuits 61–64 of the first driver block 50-1 respectively drive the odd numbered subword lines SWL(1), SWL(3), SWL(5), and SWL(7) of each of the memory cell arrays 52 and 53 in response to the predecoding signals φX1, φX3, φX5, and φX7. The word line drive circuits 57–60 of the second driver block 50-2 respectively drive the even numbered subword lines SWL(2), SWL(4), SWL(6), and SWL(8) of the first memory cell array 52 in response to the predecoding signals φX2, φX4, φX6, and φX8. The word line drive circuits 65–68 of the third driver block 50-3 respectively drive the even numbered subword lines SWL (2), SWL(4), SWL(6), and SWL(8) of the second memory cell array 53 in response to the predecoding signals φX2, φX4, φX6, and φX8.

The word line drive circuits for each word line can thus occupy a space in the vertical dimension provided for eight word lines allowing eight times the pitch for the word lines. In other words, the vertical dimension in which each word line drive circuit can be provided is eight times the pitch of the word lines. The size of the word line drive circuit can thus be increased and/or the pitch of the word lines can be relatively reduced as discussed above with regard to the example of FIG. 2. Accordingly, the degree of integration can be further increased without reducing the memory cell area.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device comprising:
   a memory cell array including a plurality of odd and even numbered subword lines extending through said memory cell array;
   a predecoder which receives a row address and generates a plurality of predecoding signals in response thereto;
   a row decoder which receives said row address and generates a word line signal in response thereto;
   a first driver block including a first plurality of word line drive circuits adjacent said memory cell array wherein each of said word line drive circuits of said first plurality is connected to a respective odd numbered subword line of said memory cell array, and wherein said first plurality of subword line drive circuits drive said respective odd numbered subword lines responsive to odd numbered predecoding signals and said word line signal; and
   a second driver block including a second plurality of word line drive circuits adjacent said memory cell array opposite said first driver block wherein each of said word line drive circuits of said second plurality is connected to a respective even numbered subword line of said memory cell array, and wherein said second plurality of subword line drive circuits drive said respective even numbered subword lines responsive to even numbered predecoding signals and said word line signal.

2. An integrated circuit memory device according to claim 1 wherein said memory cell array includes first, second, third, and fourth subword lines, wherein said first driver block includes a first word line drive circuit connected to said first subword line and a second word line drive circuit connected to said third subword line, and wherein said second driver block includes a first word line drive circuit connected to said second subword line and a second word line drive circuit connected to said fourth subword line.

3. An integrated circuit memory device according to claim 2 wherein said predecoder generates first, second, third, and fourth predecoding signals responsive to said received row address, and wherein said first and second word line drive circuits of said first driver block are respectively responsive to said first and third predecoding signals, and wherein said first and second word line drive circuits of said second driver block are respectively responsive to said second and fourth predecoding signals.

4. An integrated circuit memory device according to claim 1 wherein said even and odd numbered subword lines of said memory cell array are parallel with said even numbered subword lines being interleaved between said odd numbered subword lines.

5. An integrated circuit memory device according to claim 1 further comprising:
   a second memory cell array adjacent said first driver block opposite said first memory cell array wherein said second memory cell array includes a second plurality of odd and even numbered subword lines extending through said memory cell array wherein each of said word line drive circuits of said of said first plurality is connected to a respective odd numbered subword line of said second memory cell array, and wherein said first plurality of subword line drive circuits drive said respective odd numbered subword lines of said second memory cell array responsive to said odd numbered predecoding signals and said word line signal; and
   a third driver block including a third plurality of word line drive circuits adjacent said second memory cell array opposite said first driver block wherein each of said word line drive circuits of said third plurality is connected to a respective even numbered subword line of said second memory cell array, and wherein said third plurality of subword line drive circuits drive said respective even numbered subword lines responsive to said even numbered predecoding signals and said word line signal.

6. An integrated circuit memory device according to claim 1 wherein a plurality of memory cells of said memory cell array is connected to a respective one of said subword lines.

7. An integrated circuit memory device according to claim 1 wherein said subword lines of said memory cell array are connected through respective word line drive circuits to a common fixed electrical potential.

8. An integrated circuit memory device according to claim 1 wherein said first and second pluralities of said word line drive circuits are disposed in parallel with respect to each other and in a direction orthogonal with respect to said at least one word line.

9. An integrated circuit memory device according to claim 1 further comprising:
a first plurality of bit lines extending through said memory cell array.

10. A method for accessing data from an integrated circuit memory device having a memory cell array including a plurality of odd and even numbered subword lines extending through said memory cell array, said method comprising the steps of:
generating a plurality of predecoding signals in response to a received row address;
generating a word line signal in response to said row address;
driving said respective odd numbered subword lines responsive to odd numbered predecoding signals and said word line signal; and
driving said respective even numbered subword lines responsive to even numbered predecoding signals and said word line signal.

11. A method according to claim 10 wherein said integrated circuit memory device also has a second memory cell array including a second plurality of odd and even numbered subword lines extending through said second memory cell array, said method further comprising the steps of:
driving said respective odd numbered subword lines of said second memory cell array responsive to said odd numbered predecoding signals and said word line signal; and
driving said respective even numbered subword lines of said second memory cell array responsive to said even numbered predecoding signals and said word line signal.

12. An integrated circuit memory device comprising:
first and second memory cell arrays;
a predecoder which receives row addresses and generates respective first, second, third, and fourth predecoding signals in response thereto;
at least one word line;
a first plurality of subword lines corresponding to said at least one word line, wherein each of said subword lines of said first plurality extends through said first memory cell array;
a second plurality of subword lines corresponding to said at least one word line, wherein each of said subword lines of said second plurality extends through said second memory cell array;
a first driver block including a first plurality of word line drive circuits disposed between said first and second memory cell arrays wherein a first and a second word line drive circuit of said first driver block are respectively connected to first and third subword lines of said first and second memory cell arrays, and wherein said first word line drive circuit drives said first subword lines of said first and second memory cell arrays responsive to said first predecoding signal and a signal on said at least one word line, and wherein said second word line driver circuit drives said third subword lines of said first and second memory cell arrays responsive to said third predecoding signal and a signal on said at least one word line;
a second driver block including a second plurality of word line drive circuits disposed adjacent said first memory cell array opposite said first driver block wherein a first and second word line drive circuit of said second driver block are respectively connected to second and fourth subword lines of said first memory cell array, and wherein said first word line drive circuit drives said second subword line of said first memory cell array responsive to said second predecoding signal and said signal on said word line, and wherein said second word line drive circuit drives said fourth word line of said first memory cell array responsive to said fourth predecoding signal and a signal on said at least one word line; and
a third driver block including a third plurality of word line drive circuits disposed adjacent said second memory cell array opposite said first driver block wherein a first and second word line drive circuit of said third driver block are respectively connected to second and fourth subword lines of said second memory cell array, and wherein said first word line drive circuit drives said second subword line of said second memory cell array responsive to said second predecoding signal and said signal on said at least one word line, and wherein said second word line drive circuit drives said fourth word line of said second memory cell array responsive to said fourth predecoding signal and a signal on said at least one word line.

13. An integrated circuit memory device according to claim 12 wherein a plurality of memory cells within each of said memory cell arrays is connected to a respective one of said subword lines.

14. An integrated circuit memory device according to claim 12 wherein said subword lines of one of said first and second memory cell arrays are connected through respective word line drive circuits to a common fixed electrical potential.

15. An integrated circuit memory device according to claim 12 wherein said first and second word line drive circuits of each of said driver blocks are disposed in parallel with respect to each other and in a direction orthogonal with respect to said at least one word line.

16. An integrated circuit memory device according to claim 12 further comprising:
a first plurality of bit lines extending through said first memory cell array; and
a second plurality of bit lines extending through said second memory cell array.

17. An integrated circuit memory device comprising:
first and second memory cell arrays;
a predecoder which receives row addresses and generates eight respective predecoding signals in response thereto;
at least one word line;
a first plurality of eight subword lines corresponding to said at least one word line, wherein each of said eight subword lines of said first plurality extends through said first memory cell array;
a second plurality of eight subword lines corresponding to said at least one word line, wherein each of said eight subword lines of said second plurality extends through said second memory cell array;
a first driver block including a first plurality of word line drive circuits disposed between said first and second memory cell arrays wherein said word line drive circuits of said first plurality are connected to respective odd numbered subword lines of said first and second memory cell arrays, and wherein said word line drive circuits drive said respective odd numbered subword lines responsive to odd numbered predecoding signals and a signal on said at least one word line;

a second driver block including a second plurality of word line drive circuits disposed adjacent said first memory cell array opposite said first driver block wherein said word line drive circuits of said second plurality are connected to respective even numbered subword lines of said first memory cell array, and wherein said word line drive circuits drive said respective even numbered subword lines responsive to even numbered predecoding signals and said signal on said at least one word line; and a third driver block including a third plurality of word line drive circuits disposed adjacent said second memory cell array opposite said first driver block wherein said word line drive circuits of said third plurality are connected to respective even numbered subword lines of said second memory cell array, and wherein said word line drive circuits drive said respective even numbered subword lines responsive to said even numbered predecoding signals and said signal on said at least one word line.

18. An integrated circuit memory device according to claim 17 wherein a plurality of memory cells within each of said memory cell arrays is connected to a respective one of said subword lines.

19. An integrated circuit memory device according to claim 17 wherein said subword lines of one of said first and second memory cell arrays are connected through respective word line drive circuits to a common fixed electrical potential.

20. An integrated circuit memory device according to claim 17 wherein said each of said driver blocks includes four word line drive circuits disposed in parallel with respect to each other and in a direction orthogonal with respect to said at least one word line.

21. An integrated circuit memory device according to claim 17 further comprising:

a first plurality of bit lines extending through said first memory cell array; and a second plurality of bit lines extending through said second memory cell array.

* * * * *